US005610862A

United States Patent [19]
Teel

[11] Patent Number: 5,610,862
[45] Date of Patent: *Mar. 11, 1997

[54] PRE-CHARGED SLAVE LATCH WITH PARALLEL PREVIOUS STATE MEMORY

[75] Inventor: Thomas A. Teel, Carrollton, Tex.

[73] Assignee: SGS-Thomson Microelectonics, Inc., Carrollton, Tex.

[*] Notice: The term of this patent shall not extend beyond the expiration date of Pat. No. 5,491,663.

[21] Appl. No.: 544,097

[22] Filed: Oct. 17, 1995

Related U.S. Application Data

[63] Continuation of Ser. No. 346,748, Nov. 30, 1994, Pat. No. 5,491,663.
[51] Int. Cl.[6] .................................................. G11C 7/00
[52] U.S. Cl. ............... 365/189.05; 365/203; 365/230.01; 365/230.08
[58] Field of Search ....................... 365/189.05, 230.08, 365/233, 235, 189.01, 203, 230.01

[56] References Cited

U.S. PATENT DOCUMENTS 5,491,663  2/1996  Teel ...................................... 365/189.05

Primary Examiner—David C. Nelms
Assistant Examiner—Vu A. Le
Attorney, Agent, or Firm—Theodore E. Galanthay; Lisa K. Jorgenson; Renee M. Larson

[57] ABSTRACT

According to the present invention, a method and structure for using pre-charged data path techniques in those applications where it is necessary to retain the previous state of data is presented. In the preferred embodiment, a Pre-Charged Slave Latch with Parallel Previous State Memory circuit of a burst SRAM employs a parallel memory element configuration. In conjunction with this parallel memory element configuration, three stages are disclosed to implement a pre-charged data path technique for a burst SRAM memory. First, external data is loaded into the Pre-Charged Slave Latch with Parallel Previous State Memory circuit. Next, during a burst address sequence state of the Burst SRAM, the previous address state is allowed to propagate through the address decode path of the burst SRAM. Finally, the output signal of the Pre-Charged Slave Latch with Parallel Previous State Memory is pre-charged to an inactive state in parallel with other circuit elements of the pre-charged address decode path. Thus, the advantages of pre-charged data path techniques such as increased gate fanout in the address decode path and increased memory access which results in faster speed may be enjoyed in conjunction with burst SRAM memories and other applications where it is necessary to retain a previous state of data.

24 Claims, 2 Drawing Sheets

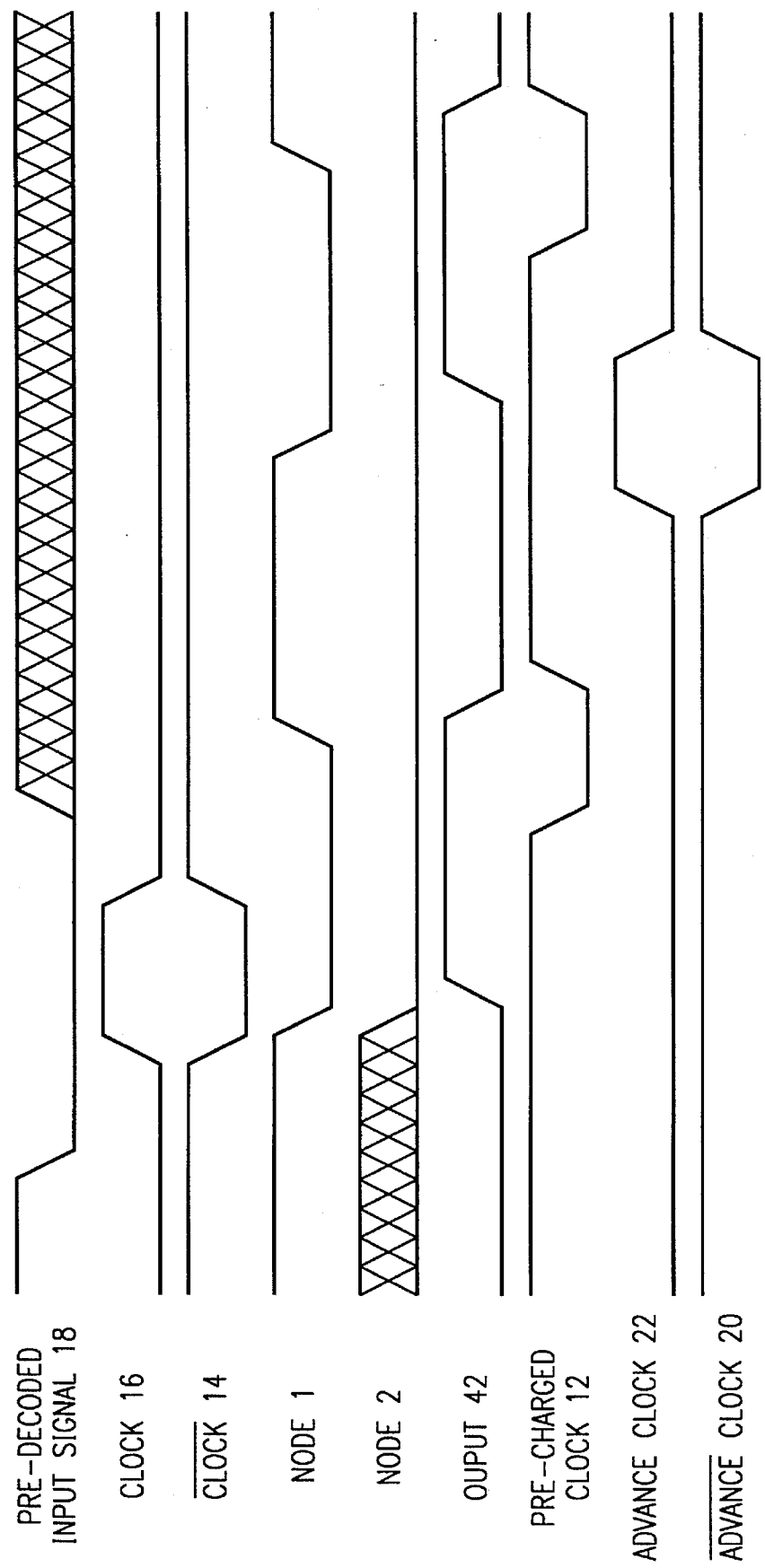

Applying the present invention to a clocked burst SRAM provides a preferred embodiment of the present invention; however, it is understood that the present invention may additionally in any variety of applications where it is desirable to retain a previous state of data and where pre-charged data path techniques are to be used. To effectively use the pre-charged decode path technique in a clocked burst SRAM, it is necessary to devise a technique using a method and structure that will allow the previous burst sequence state to be available and selectable if so required by the state of control inputs of the burst SRAM. A circuit technique that will accomplish this utilizes a parallel memory element configuration.

Referring to FIG. 1, a Pre-Charged Slave Latch with Parallel Previous State Memory circuit 10 which has a parallel memory element configuration is shown. The data and strobe clock timing for this circuit is shown in FIG. 2. The circuit 10 of FIG. 1 is comprised of the following logic elements: pass gates 24, 26, 28 and 41, pull-up transistors 30 and 32, and inverters 34, 36, 38, and 40. Circuitry 10 is supplied with Pre-Charge Clock signal 12 (an active low signal), Clock signal 16 and Clock bar signal 14, Pre-Decoded input signal 18, and Advance Clock signal 22 and Advance Clock bar signal 20. Clock signal 16 and Clock bar signal 14 control pass gates 24, 26, and 28. Pass gate 24 is presented with Pre-Decoded input signal 18 and, when allowed by Clock signal 16 and Clock bar signal 14, pass gate 24 passes through Pre-Decoded input signal 18 as an output signal which is presented to inverter 34 where it is inverted to render Output signal 42. The gate of pull-up transistor 30 is presented with Pre-Charge Clock signal 12 and pull-up transistor 30 is connected to power supply Vcc through a source/drain as shown; a source/drain of transistor 32 is also connected to power supply Vcc. Node 1 is defined as the electrical connection of the output signal of pass gate 24, the input signal of inverter 34, a source/drain of transistor 30, a source/drain of transistor 32, and the output signal of pass gate 41.

Clock signal 16 and Clock bar signal 14 control pass gate 26 which is provided with Pre-Decoded input signal 18. The output signal of pass gate 26 is provided to inverter 36. A feedback loop of inverter 36 is provided by inverter 38 and pass gate 28. The output signal of inverter 40 defines Node 2. Advance Clock signal 22 and Advance Clock bar signal 20 control pass gate 41 which passes through the signal at Node 2 when permitted to do so by Advance Clock signal 22 and Advance Clock bar signal 20. Advance Clock signal 22 and Advance Clock bar signal 20 advance the burst counts produced by the Burst SRAM. The output signal of pass gate 41, together with the output signal of pass gate 24, define an input signal to inverter 34 which in turn produces Output signal 42.

Utilizing the circuit 10 of FIG. 1, the present invention goes through three stages to implement a pre-charged data path technique. First, external data is loaded into circuit 10 of FIG. 1. Next, during a burst address sequence state of the Burst SRAM, the previous address state is allowed to propagate through the address decode path of FIG. 1. Finally, the Output signal 42 of FIG. 1 is pre-charged to an inactive state in parallel with other circuit elements of the pre-charged address decode path. Each of these stages will now be discussed in more detail.

First, as mentioned previously, external loading takes place. During external (or base address) loading, Clock signal 16 is a high logic level, Clock bar signal 14 is a low logic level and the Pre-Decoded input signal 18 is allowed to ripple through pass gate 24 and inverter 34 to Output signal 42. At the same time, pass gate 26 is also opened to store the data state of the Pre-Decoded input signal 18 in the static latch composed of pass gate 28 and inverters 36, 38, and 40. Note that all other clocks, Pre-charge Clock signal 12, Advance Clock signal 20 and Advance Clock bar signal 22, are inactive during this period.

Next, during a burst address sequence state of the burst SRAM, Clock signal 16 and Clock bar signal 14 remain inactive while Advance Clock signal 22 goes to a high logic level and Advance Clock bar signal 20 goes to a low logic level in order to allow the previous address state of Pre-Decode input signal 18 to propagate through the address decode path to Output signal 42. Finally, after Clock signal 16 and Clock bar signal 14, or Advance Clock signal 20 and Advance Clock bar signal 22, become inactive but prior to the next machine state, Pre-Charge clock signal 12 resets (or pre-charges) both Node 1 and Output signal 42 to an inactive state in parallel with the other circuit elements of the pre-charged address decode path.

Referring to FIG. 2, a timing diagram clearly shows these three stages and the impact on the following signals and nodes: Pre-Decoded signal 18, Clock signal 16, Clock bar signal 14, Node 1, Node 2, Output signal 42, Pre-Charge Clock signal 12, Advance Clock signal 22, and Advance Clock bar signal 20.

The present invention presents a parallel memory element configuration capable of using pre-charged data path techniques for those applications where it is necessary to retain previous data. According to the preferred embodiment of the invention, external data is loaded into a burst SRAM parallel memory element represented by circuit 10 of FIG. 1. Next, during a burst address sequence state of the Burst SRAM, the previous address state is allowed to propagate through the address decode path of FIG. 1. Finally, the Output signal 42 of FIG. 1 is pre-charged to an inactive state in parallel with other circuit elements of the pre-charged address decode path. Thus, pre-charged data path techniques may be successfully used in burst SRAM memory design, for example, by taking into account the special considerations attendant with the necessity of having the previous burst sequence state available and selectable if so required by the burst SRAM control input signals. Additionally, the present invention may be used in the many applications where decision trees, for instance, are employed to make a decision or take a branch of a decision tree based upon the logic state of old data. Thus, the advantages of pre-charged data path techniques such as increased gate fanout in the address decode path and increased memory access which results in faster speed may be enjoyed in conjunction with burst SRAM memories and other applications where it is necessary to retain a previous state of data.

While the invention has been particularly shown and described with reference to a preferred embodiment, it will be understood by those skilled in the art that various changes in form and detail may be made therein without departing from the spirit and scope of the invention.

What is claimed is:

1. A method for retaining a previous state of data using a pre-charged data path technique, comprising the steps of:

loading a input signal to a parallel memory element;

allowing a previous state of the input signal to propagate through an address decode path to an output node of the parallel memory element; and pre-charging an output signal on the output node of the parallel memory element to an inactive state.

2. The method of claim 1, wherein the input signal is an address signal.

PRE-CHARGED SLAVE LATCH WITH PARALLEL PREVIOUS STATE MEMORY

This is a Continuation of application Ser. No. 08/346,748, filed Nov. 30, 1994 U.S. Pat. No. 5,491,663.

BACKGROUND OF THE INVENTION

High speed computer systems often utilize burst mode clocked static random access memories (SRAMs) as secondary data cache memory. A burst mode SRAM is a synchronous SRAM device which has a burst mode and is therefore used as an integral component in cache memory systems such as the Intel 486 or the Motorola family of microprocessors. The burst SRAM device has a burst counter which controls the burst of data produced by the burst mode. The burst mode address sequence of a burst SRAM device is advantageous for fast cache-fill operations. At each clock cycle, the cache memory chip must decide, based on the current state of the control inputs, whether to initiate a burst count address based on the internal address state of the previous clock state or to load in the current external address presented at the memory chip address inputs. In addition to burst SRAM technology, there are many other applications where it is necessary to retain old data and therefore be able to know what a previous state of data was. For instance, any number of logic applications which employ decision trees commonly make a decision or take a branch of a decision tree based upon the logic state of old data.

In high speed clocked memory design, the overall memory access delay is often enhanced by using pre-charged data path techniques that increase effective gate fanout in the implementation of the address decode path and also minimize access delays thereby increasing the speed of the memory device. This approach requires that the address decode path be reset (or pre-charged) to a given logic state, usually inactive, prior to the address decode path master clock strobe. Address inputs to the pre-charged address decode path must also be valid prior to the active strobe. When the decode path strobe goes active, the input data (or address) is allowed to enter the pre-charged decode path and ripple through to the output stage. When the decode path strobe goes inactive, the data or address is usually latched in the output stage and the decode path is once more pre-charged to the inactive state.

While the pre-charged data path techniques have been successfully used for high speed clocked memory design, they have never been employed in applications where it is necessary to retain old data in order to know the previous state of the data, such as is the case with burst SRAM technology. Burst SRAM memory design present difficulties in using pre-charged data path techniques because of the special considerations attendant with the necessity of having the previous burst sequence state available and selectable if so required by the burst SRAM control input signals. Thus, the advantages of the pre-charged data path techniques such as increased gate fanout in the address decode path and increased memory access have to date not been available on burst SRAM memories. There is an unmet need in the art to be able to effectively use pre-charged decode path techniques in technologies where it is necessary to retain old data for possible future use, such as clocked burst SRAM technology.

SUMMARY OF THE INVENTION

It would be advantageous in the art to be able to use pre-charged data path techniques in applications where it is necessary to retain old data for possible future use.

It would further be advantageous in the art to be able to use pre-charged data path techniques in burst SRAM technology applications.

Therefore, according to the present invention, a method and structure for using pre-charged data path techniques in those applications where it is necessary to retain the previous state of data is presented. In the preferred embodiment, a Pre-Charged Slave Latch with Parallel Previous State Memory circuit of a burst SRAM employs a parallel memory element configuration. In conjunction with this parallel memory element configuration, three stages are disclosed to implement a pre-charged data path technique for a burst SRAM memory. First, external data is loaded into the Pre-Charged Slave Latch with Parallel Previous State Memory circuit. Next, during a burst address sequence state of the Burst SRAM, the previous address state is allowed to propagate through the address decode path of the burst SRAM. Finally, the output signal of the Pre-Charged Slave Latch with Parallel Previous State Memory is pre-charged to an inactive state in parallel with other circuit elements of the pre-charged address decode path. Thus, the advantages of pre-charged data path techniques such as increased gate fanout in the address decode path and increased memory access which results in faster speed may be enjoyed in conjunction with burst SRAM memories and other applications where it is necessary to retain a previous state of data.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIG. 2 is a timing diagram of data and clock timing, according to the present invention.

DESCRIPTION OF THE INVENTION

Figure 1:
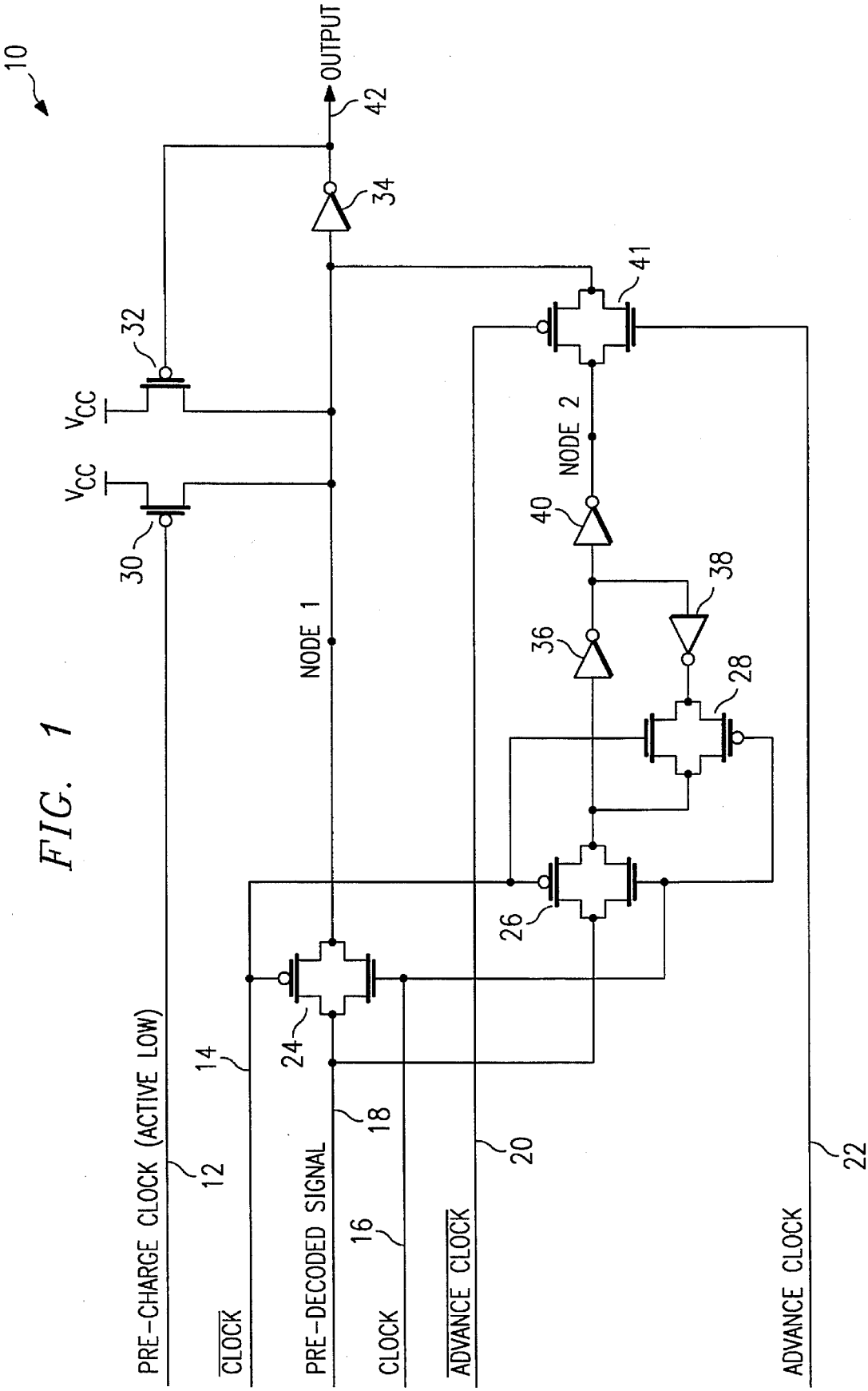
FIG. 1 is a schematic diagram of a Pre-Charged Slave Latch with Parallel Previous State Memory circuit, according to the present invention.

The present invention presents a method and structure for using pre-charged data path techniques in those applications where it is necessary to retain the previous state of data. Pre-charged data path techniques may be successfully used in burst SRAM memory design, for example, by taking into account the special considerations attendant with the necessity of having the previous burst sequence state available and selectable if so required by the burst SRAM control input signals. Additionally, the present invention may be used in the many applications where decision trees, for instance, are employed to make a decision or take a branch of a decision tree based upon the logic state of old data. Thus, the advantages of pre-charged data path techniques such as increased gate fanout in the address decode path and increased memory access which results in faster speed may be enjoyed in conjunction with burst SRAM memories and other applications where it is necessary to retain a previous state of data.

3. The method of claim 1, wherein during the step of loading the input signal to the parallel memory element, a first clock signal equal to a first logic state controls a first pass gate of the parallel memory element, thereby allowing the input signal to propagate through the parallel memory element to the output node of the parallel memory element and to be stored in a storage element of the parallel memory element and wherein a second clock signal of the parallel memory element which controls a second pass gate of the parallel memory element is in an inactive state during the steps of loading the input signal to the parallel memory element;

wherein the step of allowing the previous state of the input signal to propagate through an address decode path of the parallel memory element happens during a burst address sequence and the first clock signal is in an inactive state and the second clock signal is in an active state; and wherein the step of pre-charging the output signal of the parallel memory element to an inactive state occurs after the first clock signal or the second clock signal become inactive but before a next machine cycle.

4. The method of claim 3, wherein the storage element of the parallel memory element is a static latch.

5. The method of claim 3, wherein allowing the input signal to propagate through the parallel memory element to the output node of the parallel memory element and to be stored in a storage element of the parallel memory element makes the previous state of the input signal available and selectable.

6. The method of claim 3, wherein the first clock signal of the parallel memory element remains inactive while the second clock signal goes to a first logic state to allow a previous address state of the input signal to propagate through an address decode path to the output node of the parallel memory element.

7. The method of claim 1, wherein the parallel memory element is part of a clocked burst static random access memory (SRAM) device.

8. The method of claim 7, wherein the parallel memory element is a pre-charged slave latch with parallel previous state memory circuit.

9. The method of claim 7, wherein the step of allowing the previous state of the input signal to propagate through the address decode path of the parallel memory element happens during a burst address sequence of the clocked burst SRAM device.

10. The method of claim 9, wherein a first clock signal of the parallel memory element remains inactive while a second clock signal goes to a first logic state to allow the previous address state of the input signal to propagate through the address decode path to the output node of the parallel memory element.

11. The method of claim 10, wherein the second clock signal is an advance clock signal which advances the burst address sequence of the burst SRAM.

12. A parallel memory element structure for retaining a previous state of data, comprising:

a first clock signal;

a second clock signal;

a input signal to a first pass gate of the parallel memory element structure, wherein the first pass gate is controlled by the first clock signal and the first pass gate passes through the input signal to an output node of the first pass gate when controlled to do so by the first clock signal;

a first inverter element connected to an output node of the first pass gate;

an output node, having an output signal, connected to an output terminal of the first inverter;

a second pass gate controlled by the second clock signal and connected to an input terminal of the first inverter; and a third pass gate controlled by the first clock signal which stores a data state of the input signal in a storage element connected to the third pass gate when controlled to do so by the first clock signal.

13. The structure of claim 12, wherein the input signal is an address signal.

14. The structure of claim 12, wherein the storage element of the parallel memory element is a static latch.

15. The structure of claim 12, wherein the input signal is loaded to the parallel memory element when the first clock signal is equal to a first logic state and controls the first pass gate of the parallel memory element to allow the input signal to propagate through an address decode path to the output node and to be stored in the storage element.

16. The structure of claim 15, wherein allowing the input signal to propagate to the output node of the parallel memory element and to be stored in the storage element of the parallel memory element makes the previous state of the input signal available and selectable.

17. The structure of claim 15, wherein the first clock signal remains inactive while the second clock signal goes to a first logic state to allow a previous address state of the input signal to propagate through the address decode path to the output node of the parallel memory element.

18. The structure of claim 15, wherein after the input signal is allowed to propagate through the address decode path, a previous state of the input signal is allowed to propagate through the address decode path during a burst address sequence.

19. The structure of claim 18, wherein after the previous state of the input signal is allowed to propagate through the address decode path during a burst address sequence, the output signal is pre-charged to an inactive state after the first clock signal or the second clock signal become inactive but before a next machine cycle.

20. The structure of claim 12, wherein the parallel memory element structure is part of a clocked burst static random access memory (SRAM) device.

21. The structure of claim 20, wherein the parallel memory element structure is a pre-charged slave latch with parallel previous state memory circuit.

22. The structure of claim 20, wherein the previous state of the input signal is allowed to propagate through the address decode path of the parallel memory element structure during a burst address sequence of the clocked burst SRAM device.

23. The structure of claim 22, wherein the first clock signal of the parallel memory element remains inactive while the second clock signal goes to a first logic state to allow the previous address state of the input signal to propagate through the address decode path to the output node of the parallel memory element structure.

24. The structure of claim 23, wherein the second clock input signal is an advance clock signal which advances the burst address sequence of the burst SRAM.

* * * * *

UNITED STATES PATENT AND TRADEMARK OFFICE
CERTIFICATE OF CORRECTION

PATENT NO. : 5,610,862

DATED : March 11, 1997

INVENTOR(S) : Thomas A. Teel

It is certified that error appears in the above-identified patent and that said Letters Patent is hereby corrected as shown below:

On the title page, item [73], delete the word "Microelectonics" and substitute --Microelectronics--.

Signed and Sealed this

Seventeenth Day of March, 1998

Attest:

BRUCE LEHMAN

Attesting Officer

Commissioner of Patents and Trademarks